United States Patent [19]

Aldridge

[11] 3,898,579

[45] Aug. 5, 1975

[54] FREQUENCY CONTROL CIRCUITS FOR PHASE LOCKED LOOP FREQUENCY SYNTHESIZERS

[75] Inventor: Don W. Aldridge, Mesa, Ariz.

[73] Assignee: Motorola, Inc., Chicago, Ill.

[22] Filed: Jan. 2, 1974

[21] Appl. No.: 430,266

[52] U.S. Cl. ...................... 331/1 A; 328/14; 331/16

[51] Int. Cl.² ............................................ H03B 3/08

[58] Field of Search ................ 331/1 A, 16; 328/14

[56] References Cited

UNITED STATES PATENTS 3,753,142 8/1973 Nardin et al. ...................... 331/1 A

*Primary Examiner*—John Kominski

*Attorney, Agent, or Firm*—Vincent J. Rauner; Maurice J. Jones, Jr.

[57] ABSTRACT

Various embodiments of a control circuit which are suitable for determining the upper, lower and number of discrete, consecutive frequencies provided by a phase locked loop are disclosed. The control circuit includes a BCD adder having output terminals connected to the divide-by-N counter of a phase locked loop. BCD switches are connected to a first set of input terminals of the adder and are settable to determine the lower frequency limit of the output signal of the synthesizer. A decade counter, which is driven by a scan clock circuit, is connected to other input terminals of the BCD adder and selectively increments the divisor of the divide-by-N counter. Programmable logic circuitry is utilized to monitor the output signal of the decade counter for controlling the total number of discrete frequencies provided. Other programmable logic circuitry is utilized to monitor the output of the BCD adder to control the upper frequency limit for the output signal of the synthesizer scan. Additional BCD adders and switches are included to increase the total number of discrete frequencies provided.

16 Claims, 7 Drawing Figures

FREQUENCY CONTROL CIRCUITS FOR PHASE LOCKED LOOP FREQUENCY SYNTHESIZERS

BACKGROUND OF THE INVENTION

In existing systems, a digital phase locked loop frequency synthesizer is often comprised of a reference oscillator, phase detector, loop filter, VCO (voltage controlled oscillator) and divider. Such synthesizers are utilized to provide any one of a plurality of discrete frequencies for use in a variety of applications such as in scanning receivers and scannable transmitters. The output terminal of the VCO is connected to the input terminal of the divider, the output terminal of which is connected to an input terminal of the phase detector. The reference oscillator output terminal is connected to another input terminal of the phase detector. The output signal of the phase detector, which is proportional to the phase difference between the divider output signal and the reference oscillator signal, is fed back through the loop filter to the VCO, thus closing the loop. With the reference frequency less than the desired output frequency of the VCO, the output frequency, $f_o$, of the VCO is divided by an integer $n$. The output $f_o/n$ of the divider is compared with the reference frequency $f_{ref}$ within the phase detector and any phase difference is fed back to the VCO in the form of a control voltage which corrects the frequency of the VCO so that $f_o/n$ becomes equal to $f_{ref}$ and the loop is in lock.

By changing n in integral steps, the output frequency, $f_o$, of the synthesizer changes in steps equal to the reference frequency, $f_{ref}$. Thus, with a single crystal oscillator, many crystal controlled output frequencies are obtained. Without the phase locked loop, a separate crystal oscillator is required for each output, if a high degree of frequency stability is necessary.

Automatic scanning of many crystal controlled output frequencies is needed for numerous consumer, commercial, military and other government radio applications. More specifically, such applications include transmitters and receivers of emergency announcements occurring on each of a series of channels, which are repeated periodically, and aircraft receivers monitoring numerous channels for incoming calls.

Automatic scanning of separate crystal oscillator configurations result in complex, expensive equipment of considerable size and weight. Prior art techniques for accomplishing automatic frequency scanning of phase locked loop frequency synthesizers also suffer from some of the same problems. These prior art techniques scanning approaches present problems in meeting equipment requirements with respect to cost, reliability, ease of operation, maintainability, size and weight. A technique for automatic frequency scanning that meets such requirements and is adaptable to any type of phase locked loop frequency synthesizer is in great demand. Moreover, many prior art scanning systems utilize a plurality of discrete devices in combination with a plurality of integrated circuits. It is desirable to minimize the use of discrete devices to reduce costs and required space and to improve reliability.

SUMMARY OF THE INVENTION

One object of this invention is to provide an improved frequency synthesizer circuit.

Another object of this invention is to provide a frequency synthesizer circuit which includes one crystal controlled oscillator from which many crystal controlled consecutive, discrete output frequencies are automatically obtained.

Still another object of this invention is to provide a frequency synthesizer circuit which is relatively simple in configuration and which is suitable for automatically providing a plurality of consecutive discrete frequencies between settable upper and lower limits.

A further object of the invention is to provide a signal generating system which is reliable, maintainable, has a minimum size and weight, and can be fabricated from standard, off-the-shelf, readily available integrated circuits.

The control circuit of the invention can be utilized to control the divisor of a divide-by-N counter included in the feedback loop of a digital phase locked loop. The control circuit includes an adder having a plurality of output terminals connected to the input terminals of the divide-by-N counter. A settable switch is connected to a first set of input terminals of the adder and selects the lowest frequency provided at the output terminal of the phase locked loop. A decade counter, which is driven by a scan clock circuit, includes a set of output terminals connected to a second set of input terminals of the adder. The decade counter in cooperation with the scan clock enables the adder to increment the instantaneous frequency at the output terminal of the phase locked loop. A logic circuit is connected between output and reset terminals of the decade counter and resets the decade counter in response to the output signal state of the decade counter reaching a predetermined condition. The logic circuit thereby controls the total number of consecutive, discrete frequencies provided at the output terminal of the phase locked loop during one scan cycle. Another logic circuit can be connected between the output terminals of the adder and the reset terminal of the decade counter. This logic circuitry resets the decade counter in response to the output signal states of the BCD adder reaching a predetermined condition to thereby control the maximum frequency provided at the output terminal of the phase locked loop. The scan cycle can be stopped to provide a desired output frequency by applying a disable signal to the scan clock oscillator.

BRIEF DESCRIPTION OF THE DRAWINGS

FIG. 2 is a timing diagram of the pulses associated with the scan clock, decade counter, BCD adder and divide-by-N counter shown in FIG. 1;

DETAILED DESCRIPTION OF THE PREFERRED EMBODIMENTS

Figure 1:
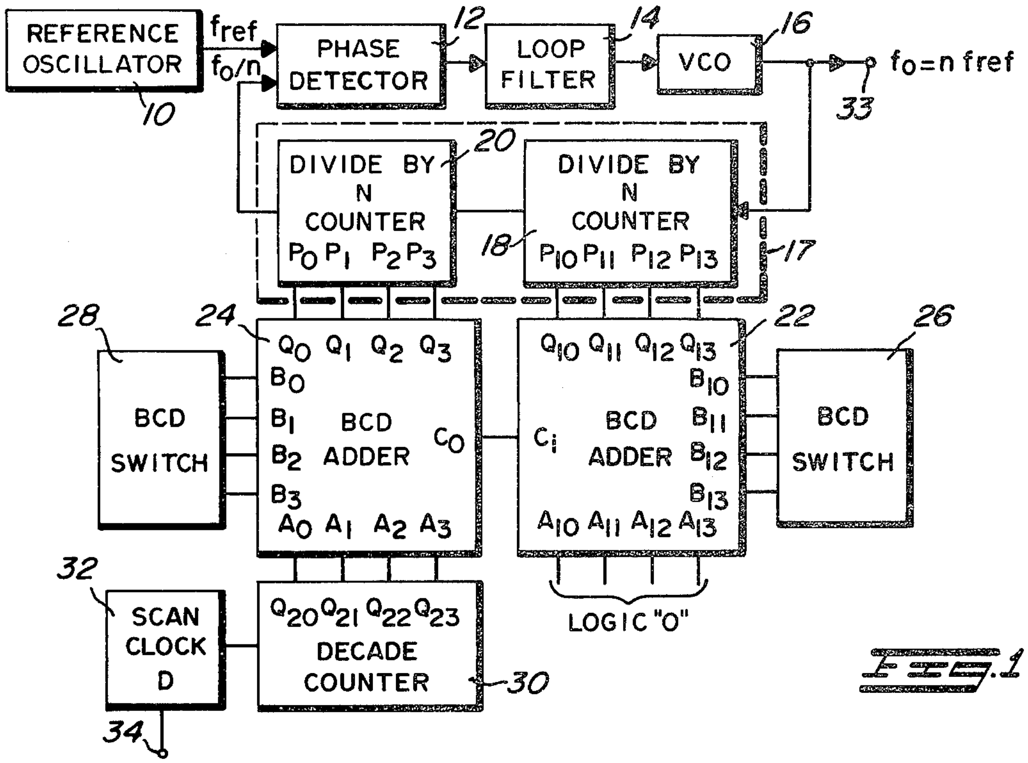
FIG. 1 is a block diagram of a phase locked loop frequency synthesizer suitable for providing 10 discrete consecutive frequencies, including a settable minimum frequency.

Description of FIG. 1 Embodiment

FIG. 1 is a block diagram of a frequency synthesizer suitable for automatically providing 10 consecutive discrete frequencies, which can be used as the local oscillator in a scanning receiver or as the master oscillator of a specialized transmitter. As shown in FIG. 1, reference oscillator 10, phase detector 12, loop filter 14, voltage controlled oscillator (VCO) 16 and divider 17, consisting of two divide-by-N counters 18 and 20, comprise a digital phase locked loop having a configuration which is known in the art. The output terminal of VCO 16 is connected to the input terminal of divider 17, the output terminal of which is connected to an input terminal of phase detector 12. The output terminal of reference oscillator 10 is also connected to an input terminal of phase detector 12 which compares the phase of the divider output signal with the phase of the reference oscillator output signal. The output signal of phase detector 12, which is proportional to the phase difference between the phase of the divider signal and the phase of the reference frequency signal, is fed through loop filter 14 to VCO 16, thus closing the loop.

The frequency of the reference signal is chosen to be $1/n$ times the desired output $f_o$ of the VCO, where $n$ is an integer. The output frequency, $f_o$, of VCO 16 is divided by the integer n by divider 17 and the resulting output signal $(f_o/n)$ of the divider is compared with the reference $f_{ref}$ within phase detector 12. Any phase difference is fed back to the VCO in the form of a control voltage which corrects the frequency of the VCO so that $f_o/n$ becomes equal to $f_{ref}$ to lock the loop in a known manner. The control of digital divide-by-N counters 18 and 20 to divide by a particular integer, is accomplished by setting their BCD (binary coded decimal) inputs at terminals $P_0$, $P_1$, $P_2$, $P_3$ and $P_{10}$, $P_{11}$, $P_{12}$, $P_{13}$ either manually or electronically to predetermined states. The preferred embodiments of the invention which will be discussed in the subsequent paragraphs facilitate electronic setting of the inputs of the divide-by-N counters.

The synthesizer configuration shown in FIG. 1 includes BCD adders 22 and 24 which provide BCD inputs to divide-by-N counters 18 and 20 respectively. Adder 24 has a first set of BCD input terminals $A_0$, $A_1$, $A_2$, $A_3$ and a second set of BCD input terminals $B_0$, $B_1$, $B_2$, $B_3$. Adder 22 also has a first set of BCD input terminals $A_{10}$, $A_{11}$, $A_{12}$, $A_{13}$ and a second set of BCD input signals $B_{10}$, $B_{11}$, $B_{12}$, $B_{13}$. Each adder provides an output signal at its output terminals, which is the BCD sum of the two sets of BCD signals at each of its input terminals and at its carry-in input terminal, such as Ci. Adder 24 included BCD output terminals $Q_0$, $Q_1$, $Q_2$, $Q_3$ and adder 22 included BCD output terminals $Q_{10}$, $Q_{11}$, $Q_{12}$, $Q_{13}$. When the BCD sum in adder 24 exceeds 9, the carry-out signal at terminal $C_0$, goes to the logic 1 state and indicates an overflow or a carry-in to BCD adder 22. This carry-in signal is added to the most significant "word" input to adder 22 through input terminals $B_{10}$, $B_{11}$, $B_{12}$, $B_{13}$ by the setting of BCD thumbwheel switch 26. The least significant word is supplied to adder 24 input terminals $B_0$, $B_1$, $B_2$, $B_3$ and input terminals $A_0$, $A_1$, $A_2$, $A_3$ by BCD thumbwheel switch 28 and decade counter 30 respectively. The thumbwheel switches are set at the lowest frequency to be scanned by setting the most significant word on switch 26 and the least significant word on switch 28.

At the start of the frequency scan the A input signals to both adders are binary 0's. The A input signals to adder 22 are fixed at 0 and the states of the A input signals to adder 24 are controlled by the scan clock 32 and decade counter 30. Therefore, at the start of each frequency scan cycle, the output frequency $f_o$ at terminal 33 is at its minimum value and n will be whatever is programmed on the B inputs of BCD adders 22 and 24 by switches 26 and 28. Next the scan clock 32 applies a pulse to the decade counter 30 which changes its $Q_{20}$ output signal from 0 to a binary 1 and adds a 1 to the B input signals of BCD adder 24, which increases the $n$ of divide-by-N counter 20 by 1. The next cycle of the scan clock advances the decade counter output signal to a decimal 2 which is added to the B input signal of adder 24. This increments the count of divide-by-N counter 20 from its original count to that original count plus 2. In a similar manner, scan clock 32 continues to advance the count of decade counter 30 up to an output count of 9. Then decade counter 30 automatically resets its output signal states back to 0 again and repeats the scan.

More specifically, if the lowest frequency of interest is 42 $f_{ref}$, then $n$ initially equals 42. Hence, 4, which is the most significant word, is set on BCD thumbwheel switch 26 and 2 which is the least significant word, is set on BCD thumbwheel switch 28. Zeros are applied to the A inputs of BCD adders 22 and 24, initially on adder 24 and constantly on adder 22. These input signal states are illustrated in scan clock cycle 0 of the timing diagram of FIG. 2 and their decimal values are listed in Table I.

Table I

| | DECIMAL VALUES OF | | | |
|---|---|---|---|---|
| SCAN CLOCK CYCLE | ADDER 24 INPUT SIGNALS FROM COUNTER 30 | DIVIDE-BY-N COUNTER 20 INPUT SIGNALS | DIVIDE-BY-N COUNTER 18 INPUT SIGNALS | $f_o = nf_{ref}$ |
| 0 | 0 | 2 | 4 | 42 $f_{ref}$ |
| 1 | 1 | 3 | 4 | 43 $f_{ref}$ |
| 2 | 2 | 4 | 4 | 44 $f_{ref}$ |
| 3 | 3 | 5 | 4 | 45 $f_{ref}$ |
| 4 | 4 | 6 | 4 | 46 $f_{ref}$ |
| 5 | 5 | 7 | 4 | 47 $f_{ref}$ |
| 6 | 6 | 8 | 4 | 48 $f_{ref}$ |
| 7 | 7 | 9 | 4 | 49 $f_{ref}$ |
| 8 | 8 | 0 | 5 | 50 $f_{ref}$ |
| 9 | 9 | 1 | 5 | 51 $f_{ref}$ |
| Reset | | | | |

At the start of clock cycle 1, the signal at terminal $A_0$ of BCD adder 24 goes to 1 as shown in FIG. 2 to result in a decimal value of 1 for the $A_0$, $A_1$, $A_2$, $A_3$ adder 24 input from counter 30, as indicated in Table I. The input signal to adder 24 terminal $B_1$ remains a logic 1, as set by the thumbwheel switch, giving a decimal value of 2 for the $B_0$, $B_1$, $B_2$, $B_3$ inputs of adder 24. Hence, divide-by-N counter 20 $P_3$, $P_2$, $P_1$, $P_0$ terminals respectively receive, 0, 0, 1, 1 signals, corresponding to a decimal value of 3. Since the input to the divide-by-N counter 18 remains set at 4, $f_o$ becomes 43 $f_{ref}$.

In like manner, during clock cycle 2, the A input signals at input adder 24 terminals $A_3$, $A_2$, $A_1$, $A_0$ and 0, 0, 1, 0 for a decimal value of 2 and the P input signals at input terminals $P_3$, $P_2$, $P_1$, $P_0$ of counter 20 are 0, 1, 0, 0 for a decimal value of 4, as indicated in FIG. 2 and Table I. Therefore, during the second scan clock cycle, $f_o$ is 44 $f_{ref}$, as indicated in Table I. As further shown by FIG. 2 (comprised of FIG. 2*a*, FIG. 2*b*, FIG. 2*c*, FIG. 2*d*, FIG. 2*e*) and Table I, $f_o$ progresses to 49 $f_{ref}$ in scan clock cycle 7.

During clock cycle 8, adder 24 input's signal from counter 30 is equivalent to a decimal value of 8, which yields a sum of 10. This causes a carry-out signal of 1 to be applied to the Ci input terminal of BCD adder 22 and 0 Q outputs to divide-by-N counter 20. Thus, the input of divide-by-N counter 18 is increased by 1 from 4 to 5, and $f_o$ becomes 50 $f_{ref}$. During clock cycle 9 the sum of the input signals to adder 24 is 11, again causing a carry-out of 1 to adder 22 and a 1 input to divide-by-N counter 20. Thus, $f_o$ becomes 51 $f_{ref}$, as indicated in Table I. The start of the next clock cycle resets all the signal outputs of decade counter 30 to 0 and the foregoing scan cycle is repeated. The synthesizer of FIG. 1 can be stopped at any of its 10 output frequencies by disabling scan clock 32. More particularly, the synthesizer of FIG. 1 can be used as the local oscillator in a scanning receiver for monitoring channels having a frequency spacing equal to the reference frequency $f_{ref}$. If a desired signal is discovered in a channel corresponding to one of the output signals of the synthesizer, then a control signal is applied to disable terminal 34 of scan clock 32 so that the desired local oscillator signal is provided at output terminal 33 until the received signal terminates. Then the control signal is removed and scan cycle continues in search of another received signal.

Figure 3:
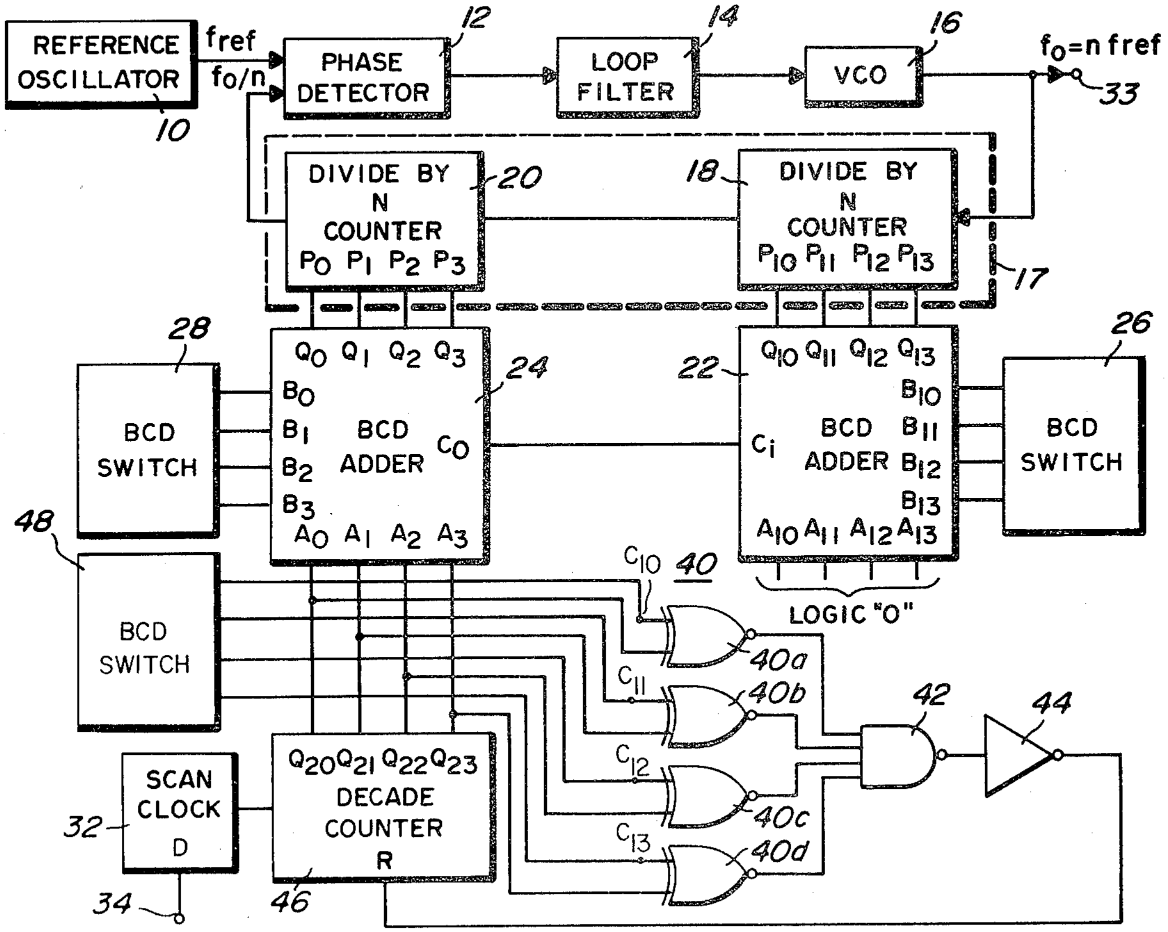
FIG. 3 is a block diagram of a phase locked loop frequency synthesizer providing a single discrete frequency or from two to 10 consecutive discrete frequencies, including a settable lower frequency.

Description of FIG. 3 Embodiment

The FIG. 3 configuration provides a single discrete frequency or scanning for from two to 10 consecutive channels, including a preset lower frequency limit, by automatically providing from 2 to 10 consecutive discrete frequencies. The same reference numbers are used throughout the various figures to designate corresponding parts. This function is facilitated by exclusive NOR circuit 40 including gates 40*a*, 40*b*, 40*c* and 40*d*. Each of the exclusive NOR gates have a first input terminal connected to one of the output terminals of decade counter 30 and another input terminal connected to a BCD switch 48. The output terminals of the exclusive NOR gates are connected to the input terminals of NAND gate 42. Inverter 44 is connected between the output terminal of NAND gate 42 and the reset terminal R of decade counter 46.

Again, the lowest channel to be scanned is set by BCD switches 26 and 28 in the same manner as for the FIG. 1 embodiment. The number of consecutive channels to be scanned is controlled by setting a "word" in the form of BCD signals at the $C_{10}$, $C_{11}$, $C_{12}$, $C_{13}$ input terminals of exclusive NOR gates 40*a*, 40*b*, 40*c* and 40*d*. Scan clock 32 advances the output signals of decade counter 46 from 0 until they are the same as the "word" set on the $C_{10}$, $C_{11}$, $C_{12}$, $C_{13}$ input terminals of the exclusive NOR gates. When this match occurs the output signals of all the exclusive NORs go to high or logic 1 levels. This switches the output signal of NAND gate 42 to a low or logic 0 which causes the output of inverter 44 to go high. Consequently, decade counter 46 is reset when the predetermined maximum frequency is reached.

Figure 4:
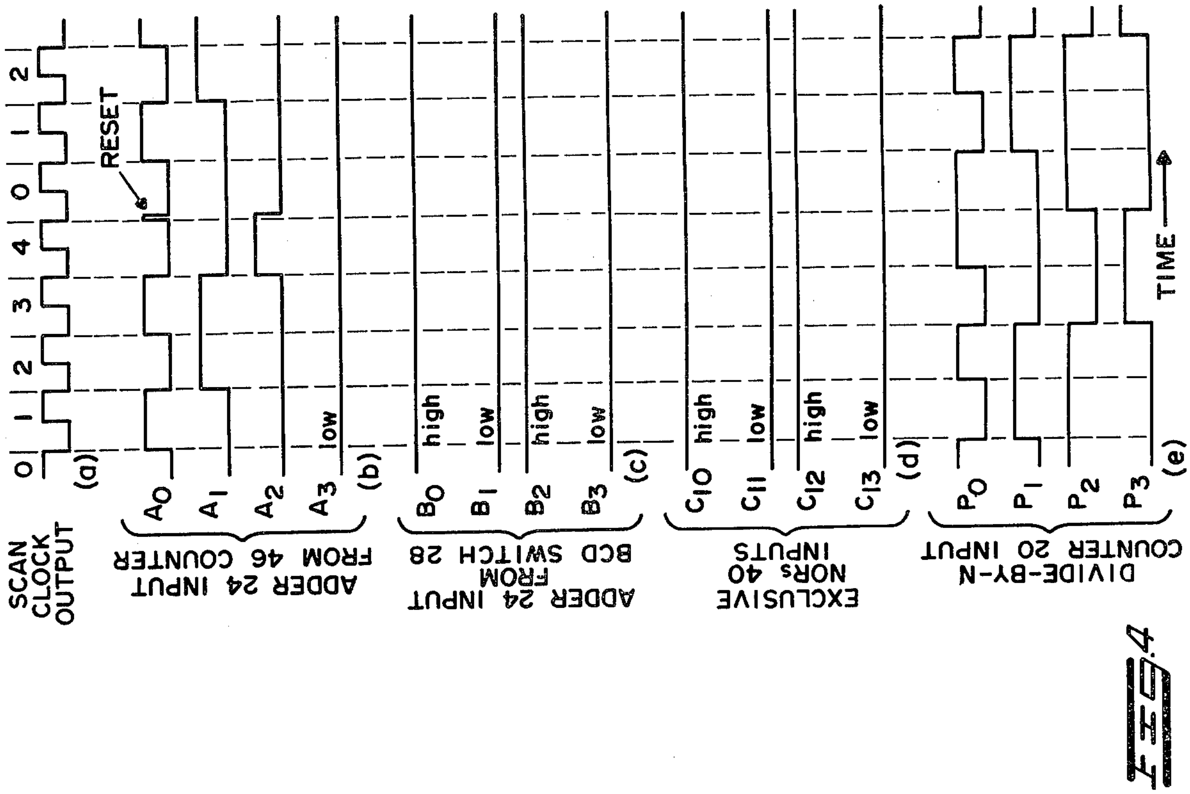
FIG. 4 is a timing diagram of the pulses associated with the scan clock, decade counter, BCD adder, exclusive NOR gates, and divide-by-N counter shown in FIG. 3.

As an example, if the lowest channel is 45 $f_{ref}$, then 4 is set on BCD switch 26 and 5 is set on BCD switch 28, as indicated in FIG. 4*c*. If 5 channels are to be scanned, the $C_{13}$, $C_{12}$, $C_{11}$ $C_{10}$ inputs to the respective exclusive NOR gates 40*d*, 40*c*, 40*b* and 40*a* are set 0, 1, 0, 1 respectively, as indicated in FIG. 4*d*. The timing diagram of FIG. 4 (comprised of FIG. 4*a*, FIG. 4*b*, FIG. 4*c*, FIG. 4*d*, FIG. 4*e*) and Table II indicate the scan progression from 45 $f_{ref}$ through 49 $f_{ref}$ during consecutive scan clock cycles. As indicated in FIG. 4*b*, the decade counter 46 output signals applied to the $A_3$, $A_2$, $A_1$, $A_0$ input terminals of BCD adder 24 respectively are 0, 1, 0, 1 for an instant after scan clock cycle 4 terminates, which time is much less than the period of a clock cycle. During this short interval both inputs of each exclusive NOR gates 40*a*, 40*b*, 40*c*, 40*d* are the same thereby causing all the exclusive NOR 40 output signals to go high and result in the resetting of decade counter 46.

TABLE II

| DECIMAL VALUES OF | | | | |
|---|---|---|---|---|
| SCAN CLOCK CYCLE | ADDER 24 INPUT SIGNALS FROM COUNTER 30 | DIVIDE-BY-N COUNTER 20 INPUT SIGNALS | DIVIDE-BY-N COUNTER 18 INPUT SIGNALS | $f_o = nf_{ref}$ |
| 0 | 0 | 5 | 4 | 45 $f_{ref}$ |
| 1 | 1 | 6 | 4 | 46 $f_{ref}$ |
| 2 | 2 | 7 | 4 | 47 $f_{ref}$ |
| 3 | 3 | 8 | 4 | 48 $f_{ref}$ |
| 4 | 4 | 9 | 4 | 49 $f_{ref}$ |
| Reset | | | | |

TABLE III

| | DECIMAL VALUES OF | | | |
|---|---|---|---|---|
| SCAN CLOCK CYCLE | ADDER 24 INPUT SIGNALS FROM COUNTER 30 | DIVIDE-BY-N COUNTER 20 INPUT SIGNALS | DIVIDE-BY-N COUNTER 18 INPUT SIGNALS | $f_o=nf_{ref}$ |
| 0 | 0 | 2 | 4 | 42 $f_{ref}$ |
| 1 | 1 | 3 | 4 | 43 $f_{ref}$ |
| 2 | 2 | 4 | 4 | 44 $f_{ref}$ |
| 3 | 3 | 5 | 4 | 45 $f_{ref}$ |
| Reset | | | | |

Scan clock 34 can be disabled to enable a selected output frequency to be created at terminal 33 for a desired amount of time to facilitate reception of a desired signal, for instance, in the previously described manner.

Figure 5:
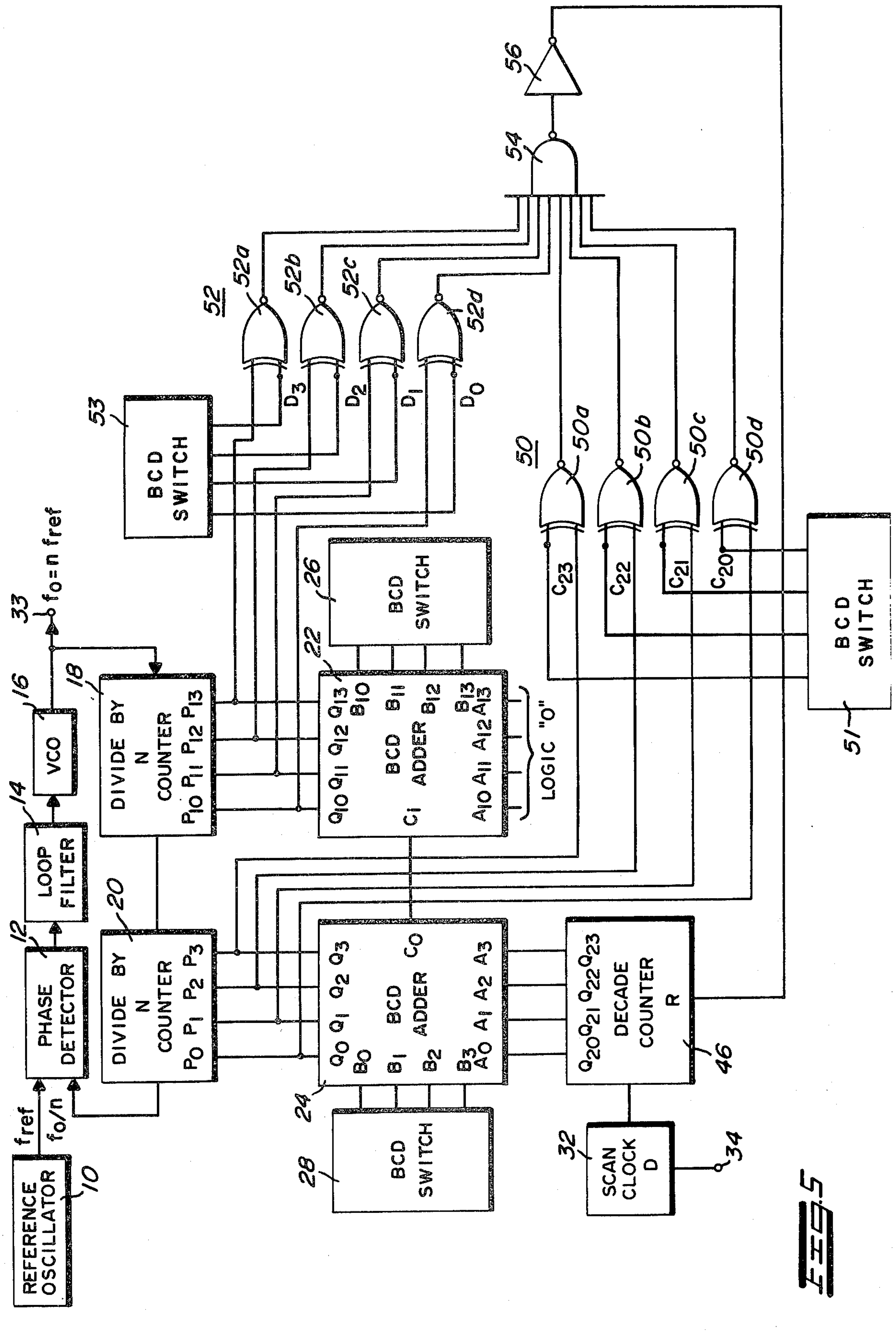
FIG. 5 is a block diagram of a phase locked loop frequency synthesizer providing a single discrete frequency or from two to 10 consecutive discrete frequencies between upper and lower predetermined frequency limits.

Description of FIG. 5 Embodiment

The synthesizer of FIG. 5 provides a single discrete frequency or automatic frequency scanning for two to 10 consecutive channels or of two to 10 discrete consecutive frequencies between two preset frequencies. Exclusive NOR gates 50*a*, 50*b*, 50*c* and 50*d* of exclusive NOR circuit 50, each include a first input terminal connected to an output terminal of BCD adder 24. BCD thumbwheel switch 51 or some other programmable device is connected to input terminals $C_{20}$, $C_{21}$, $C_{22}$ and $C_{23}$ of respective exclusive NOR gates 50*d*, 50*c*, 50*b* and 50*a*. Exclusive NOR circuit 50 enables preset of the maximum least significant word. Exclusive NOR gates 52*a*, 52*b*, 52*c* and 52*d* of exclusive NOR circuit 52 each include a first input terminal connected to an output terminal of BCD adder 22. BCD thumbwheel switch 53, or some other programmable device, is connected to input terminals $D_0$, $D_1$, $D_2$ and $D_3$ of respective exclusive NOR gates 52*d*, 52*c*, 52*b* and 52*a*. Exclusive NOR circuit 52 enables preset of the maximum most significant word. The output terminals of exclusive NOR circuits 50 and 52 are connected to the input terminals of NAND gate 54. Inverter 56 connects the output terminal of NAND gate 54 to the R or reset terminal of decade counter 46.

More specifically, the minimum frequency to be scanned is set by BCD switches 26 and 28 as has been explained with respect to the configurations of FIGS. 1 and 3. The maximum frequency to be scanned plus 1, is set on the $C_{20}$, $C_{21}$, $C_{22}$, $C_{23}$ and $D_0$, $D_1$, $D_2$ $D_3$ inputs of the exclusive NOR circuits 50 and 52 respectively with the most significant word being set on the $D_0$, $D_1$, $D_2$, $D_3$ input terminals and the least significant word being set on the $C_{20}$, $C_{21}$ $C_{22}$, $C_{23}$ input terminals. The scan cycle proceeds as described before but is stopped when the $Q_0$, $Q_1$, $Q_2$, $Q_3$ outputs of adder 24 are the same as the $C_{20}$, $C_{21}$, $C_{22}$, $C_{23}$ input of the exclusive NORs 50 and simultaneously the $Q_{10}$, $Q_{11}$, $Q_{12}$, $Q_{13}$ outputs of adder 22 are the same as the $D_0$, $D_1$, $D_2$, $D_3$ inputs of exclusive NORs 52. When this simultaneous set of conditions occur all input signals to 8-input NAND gate 54 are high, causing the output signal of inverter 56 to go high and reset decade counter 46. Consequently, the scan returns to the lowest channel and repeats.

Figure 6:
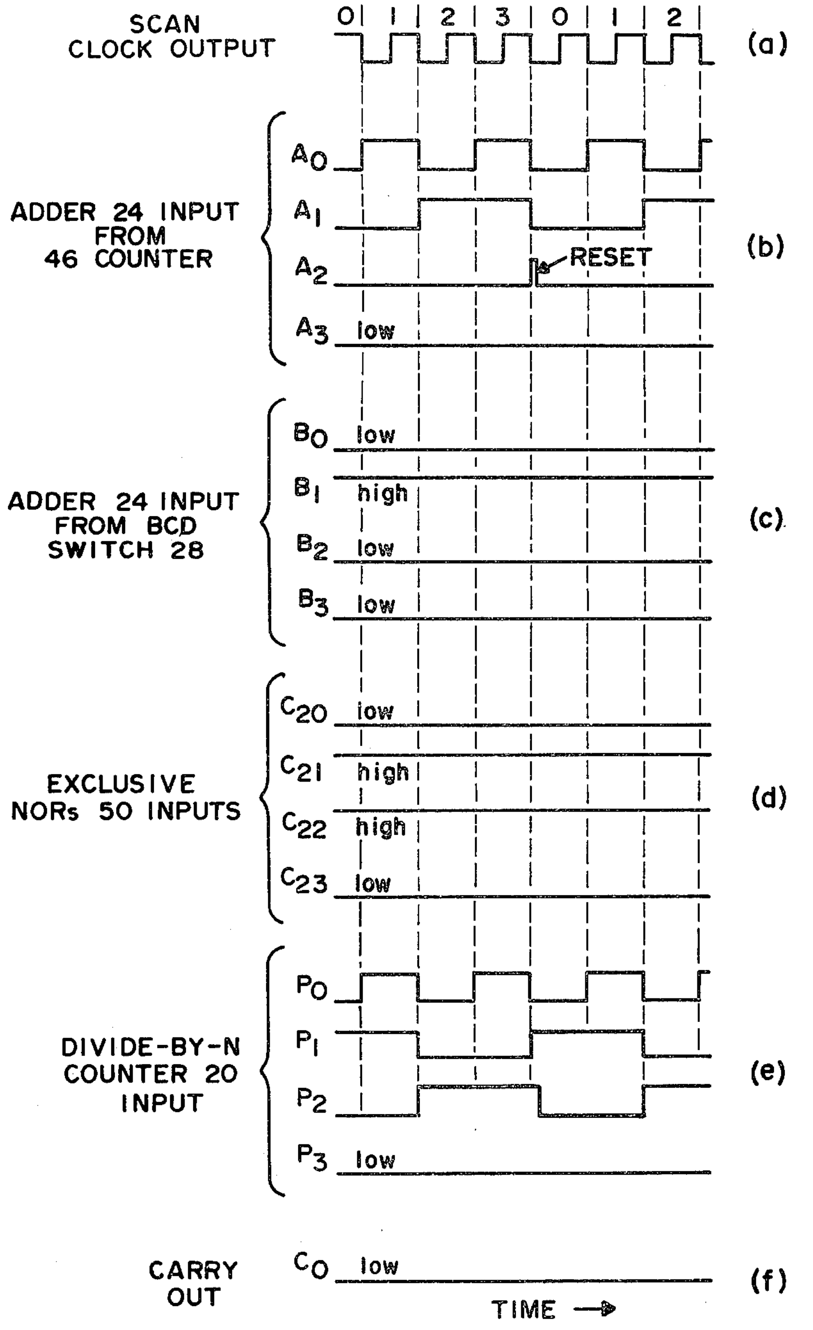
FIG. 6 is a timing diagram of the pulses associated with the scan clock, decade counter, BCD adder, exclusive NOR gates, and divide-by-N counter shown in FIG. 5.
Figure 7:
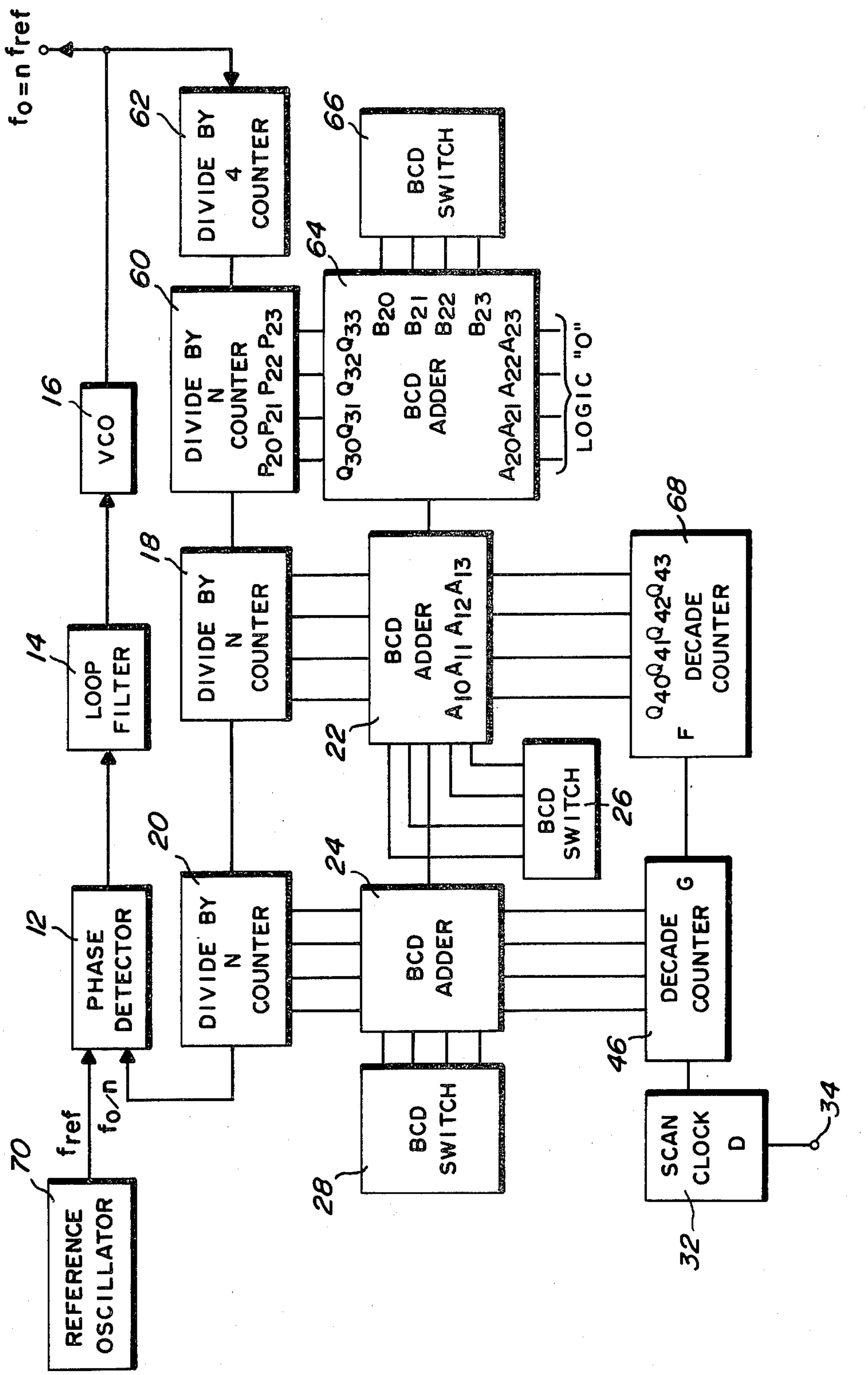

As an example, if the lowest channel is 42 $f_{ref}$, then 4 is set by BCD switch 26 and 2 is set by BCD switch 28, as shown in FIG. 6*c*. If the highest channel is 45 $f_{ref}$, then 4 is set by BCD switch 53 on the input terminals of exclusive NORs 52, that is $D_3$, $D_2$, $D_1$, $D_0$ are set to 0, 1, 0, 0. Also, 5 + 1 is set by BCD switch 51 on the inputs of exclusive NORs 50, that is $C_{23}$, $C_{22}$, $C_{21}$, $C_{20}$ are set to 0, 1, 1, 0, as shown in FIG. 6*d*. Referring to the timing diagram, FIG. 6 (comprised of FIG. 6*a*, FIG. 6*b*, FIG. 6*c*, FIG. 6*d*, FIG. 6*e*, FIG. 6*f*) and Table III, the scan progresses from 42 $f_{ref}$ through 45 $f_{ref}$.

As indicated in FIG. 6(b), the decade counter 46 output to terminals $A_3$, $A_2$, $A_1$, $A_0$ of adder 24 is 0, 1, 0, 0 for an instant after clock cycle 3. Hence, adder 24 output terminals $Q_3$, $Q_2$, $Q_1$ $Q_0$ provide 6 for an instant. That is a 0, 1, 1, 0 input signal is provided to divide-by-N counter 20, as shown in FIG. 6(e). Thus each exclusive NOR 50*a*, 50*b*, 50*c*, 50*d* has its $C_{23}$, $C_{22}$, $C_{21}$, $C_{20}$ input signal states made equal to the output of adder 24, and each exclusive NOR 52*a*, 52*b*, 52*c*, 52*d* has its $D_3$, $D_2$, $D_1$, $D_0$ input signal states made equal to the output of adder 22. Therefore, for an instant all output signals of exclusive NOR circuits 50 and 52 are high which causes decade counter 46 to reset and the scan cycle to repeat.

Figure 7:
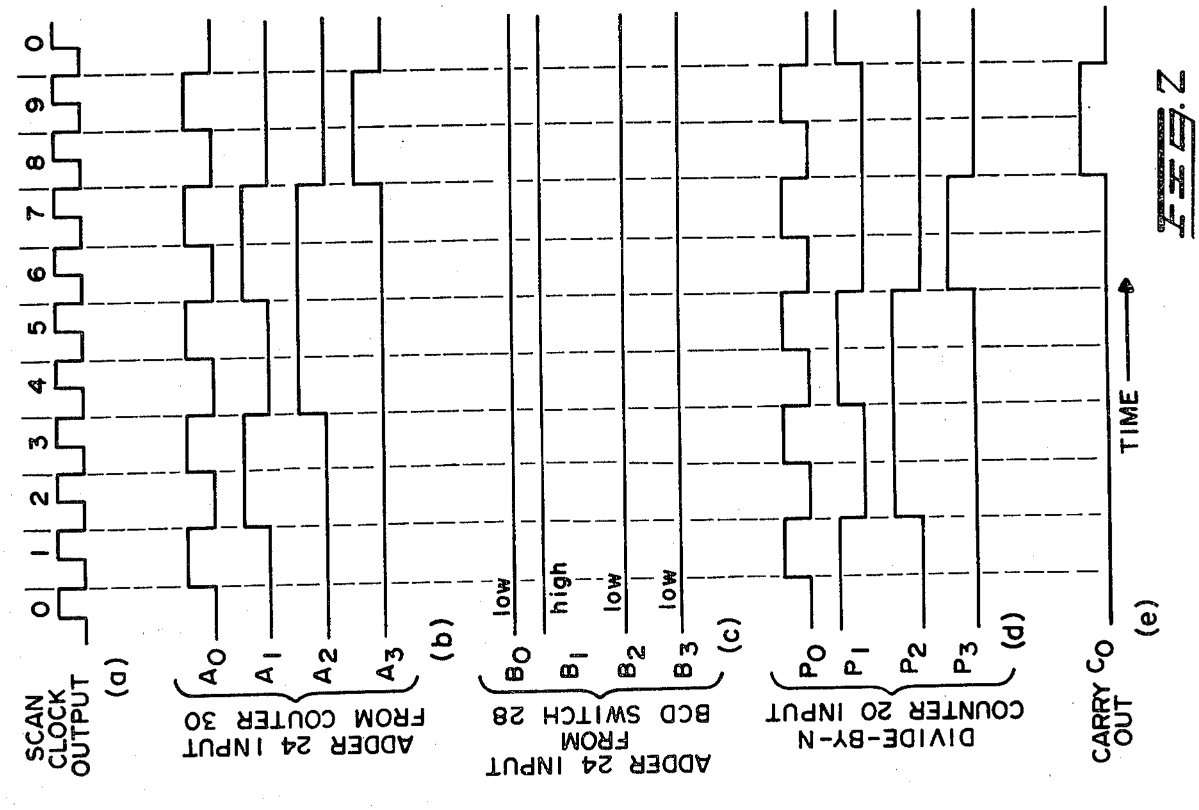
FIG. 7 is a block diagram of a phase locked loop frequency synthesizer for providing 100 consecutive discrete frequencies.

Description of FIG. 7 Embodiment

FIG. 7 shows another configuration of a frequency synthesizer system which expands the scanned frequency range. Additional divide-by-N counter 60 and divide-by-4 counter 62 are included in the loop between VCO 16 and divide-by-N counter 18. BCD adder 64 includes a set of output terminals $Q_{30}$, $Q_{31}$, $Q_{32}$, $Q_{33}$ connected to input terminals $P_{20}$, $P_{21}$, $P_{22}$, $P_{23}$ of divide-by-N counter 60, a first set of input terminals $A_{20}$, $A_{21}$, $A_{22}$ and $A_{23}$ having logic 0 signals applied thereto and a second set of input terminals $B_{20}$, $B_{21}$, $B_{22}$ and $B_{23}$ connected to the output terminals of BCD switch 66. Decade counter 68 includes output terminals $Q_{40}$, $Q_{41}$, $Q_{42}$, $Q_{43}$, which are connected to input terminals $A_{10}$, $A_{11}$, $A_{12}$, $A_{13}$ of BCD adder 22. Input terminal F of decade counter 68 is connected to output terminal G of decade counter 46.

If $f_{ref}$ is 30 kilohertz, the synthesizer of FIG. 7 will scan 100 consecutive channels, spaced 30 kilohertz apart, over a range of from 120 megahertz to 149.97 megahertz, for instance. Divider 62 divides by 4. The other divide-by-N counters 18, 20 and 60 can each be set by their associated adders at any divisor integer from 0 through 9. Thus, $n$ can vary from 4000 through 4999 and $f_o$ correspondingly can vary from 120.00 megahertz through 149.97 megahertz in 30 KHz steps. If the lowest frequency $f_o$ to be scanned is 127.50 MHz, $n$ must be 127.50 MHz divided by 30 KHz, which is 4250. To set $n$ equal to 4250, BCD switches 66, 26 and 28 can be set for divisors equal to 2, 5 and 0 respectively. The scan will proceed in 30 KHz steps from 4250 times $f_{ref}$, which is 127.50 MHz, to $(4250 + 99) f_{ref}$ which is 130.47 MHz. Thus, 100 channels are scanned in 30 KHz steps. The synthesizer of FIG. 7 is suitable for applications in commercial, aircraft and amateur radios, for instance. For the 2 meter amateur band $f_{ref}$ would be 30 KHz and n could be 4800. Then, $f_o$ will be scanned in 30 KHz steps from 144.00 MHz through $(4800 + 99) \times 30$ KHz, which is 146.97 MHz.

For operation at frequencies on the order of 150 MHz, the divide-by-4 counter 62 and the divide-by-N counter 60 must be high speed devices such as the Motorola MC–1678 with appropriate ECL logic family gates. The MC–1678 is a high speed 4-bit decade counter. The other two divide-by-N counters can be lower speed devices such as the Motorola MC–4016, which is a programmable, cascadable, modulo-N counter designed for use in frequency synthesizers and phase locked loops. The BCD adders can each be a Motorola MC–74456, which is designed to add two 4-bit numbers in BCD format. Each decade counter can be a Motorola MC–7490, which is a 4-bit decade counter.

What has been described, therefore, is an improved frequency synthesizer circuit. The various described embodiments each include only one crystal controlled oscillator from which many crystal controlled consecutive, discrete output frequencies are automatically obtained. The above described frequency synthesizer systems are relatively simple in configuration, as compared to some prior art embodiments which automatically provide a plurality of consecutive discrete frequencies between settable upper and lower limits. Since the various embodiments of the invention can be fabricated exclusively from standard, off-the-shelf, readily available integrated circuits, they are reliable, maintainable and have a minimum size and weight. As shown by the above description, the basic configuration of the synthesizer is adaptable to meet a plurality of differing requirements and, therefore, it is believed that the synthesizer of the invention could be utilized in many consumer, commercial, military and other government applications.

It is contemplated that after having read the above description of the preferred embodiments, those skilled in the art will foresee certain alterations and modifications which have not been pointed out with particularity herein. Although, specific types of semiconductor devices have been disclosed for exemplary purposes, it should be understood that a variety of components and devices may be utilized by those skilled in the art. Accordingly, this disclosure is intended as being in the nature of an explanatory illustration only and it is in no way to be considered as limiting. Therefore, the appended claims are to be interpreted as covering all modifications which fall within the true spirit and scope of the invention.

I claim:

1. In a frequency synthesizer circuit adapted to automatically provide a plurality of output signals at an output terminal, the frequency synthesizer having a phase locked loop with a divide-by-N counter having input terminals, a control circuit for adjusting the divideby-N counter including in combination:

adder means having a plurality of output terminals connected to the input terminals of the divide-by-N counter, a first set of input terminals, and a second set of input terminals;

first circuit means having output terminals connected to said first set of input terminals of said adder means, said first circuit means being adapted to determine the lowest frequency of the output signal at the output terminal of the phase locked loop;

counter means having an input terminal, a reset terminal and a plurality of output terminals, said plurality of output terminals being connected to said second set of input terminals of said adder means;

clock means having an output terminal connected to said input terminal of said counter means, said counter means being responsive to an output signal from said clock means to provide an output signal, said adder means being responsive to said output signal of said counter means to adjust the divide-by-N counter and thereby increment the frequency of the output signal at the output terminal of the phase locked loop; and logic means connected from said output terminals of said counter means to said reset terminal of said counter means, said logic means being responsive to the output signal state of said counter means reaching a predetermined condition to provide a control signal which resets said counter means to control the number of output frequencies in a scanning cycle of the frequency synthesizer.

2. The combination of claim 1 wherein said logic means further includes gate means.

3. The combination of claim 1 wherein said logic means includes in combination:

first gate means having a plurality of input terminals connected to said output terminals of said counter means and a plurality of output terminals;

second gate means having a plurality of input terminals connected to said plurality of output terminals of said first gate means and an output terminal; and inverter means connecting said output terminal of said second gate means to said reset terminal of said counter means.

4. In a frequency synthesizer having a phase locked loop with a crystal controlled reference oscillator, a detector, a loop filter, a voltage controlled oscillator, and a divide-by-N counter with first and second stages each having control terminals, a control circuit for selectively providing signals which control the divisor of the divide-by-N counter, including in combination:

first binary coded decimal adder means having a plurality of output terminals connected to the control terminals of the first stage of the divide-by-N counter, a first set of input terminals, and a second set of input terminals, said first binary coded decimal adder means also having a carry-out terminal;

first binary coded decimal switch means having a plurality of output terminals connected to said first set of input terminals of said first binary coded decimal adder means;

decade counter means having a plurality of output terminals connected to said second set of input terminals of said first binary coded decimal adder means, said decade counter further having an input terminal;

scan clock means having an output terminal connected to said input terminal of said decade counter means;

second binary coded decimal adder means having a plurality of output terminals connected to the control terminals of the second stage of the divide-by-N counter, said second binary coded decimal adder means further having a first set of input terminals, a second set of input terminals, and a carry-in terminal connected to said carry-out terminals of said first binary coded decimal adder means;

second binary coded decimal switch means having a plurality of output terminals connected to said first set of input terminals of said second binary coded decimal adder means;

first circuit means applying logical "0" states to said second set of input terminals of said second binary coded decimal adder means; and said first binary coded decimal switch means and said second binary coded decimal switch means controlling the lower frequency limit of the output signal of the phase locked loop, said scan clock means and said decade counter means cooperating to cause the count at the output terminals of said first and said second binary coded adder means to change in a predetermined manner so that the divide-by-N counter is controlled in a predetermined manner.

5. The combination of claim 4 further including in combination:

first gate means having first and second input terminals and output terminals;

third binary coded decimal switch means having output terminals connected to said first input terminals of said first gate means;

second circuit means connecting said second input terminals of said first gate means to said output terminals of said decade counter means;

second gate means having a plurality of input terminals connected to said output terminals of said first gate means and an output terminal;

third circuit means connecting said output terminals of said second gate means to a reset terminal of said decade counter means; and said first gate means facilitating control of the number of consecutive discrete frequencies of the output signal automatically provided by the phase locked loop.

6. The combination of claim 5 wherein:

said first gate means includes a plurality of exclusive NOR gates each having one of said first input terminals, one of said second input terminals, and one of said output terminals.

7. The combination of claim 6 wherein:

said second gate means includes a NAND gate means.

8. The combination of claim 6 wherein said third circuit means includes an inverter means.

9. The combination of claim 4 further including in combination:

first gate means having a plurality of first input terminals connected to said output terminals of said first binary coded decimal adder means, a plurality of second input signals and a plurality of output terminals;

second gate means having a plurality of first input terminals connected to said output terminals of said second binary coded decimal adder means, a plurality of second input terminals and a plurality of output terminals;

third binary coded decimal switch means having output terminals connected to said second input terminals of said first and said second gate means;

third gate means having a plurality of input terminals connected to said output terminals of said first gate means and to said output terminals of said second gate means and an output terminal; and second circuit means connecting said output terminal of said third gate means to said reset terminal of said decade counter means.

10. The combination of claim 9 wherein said first gate means and said second gate means each includes a plurality of exclusive NOR gates, each of said exclusive NOR gates having one of said first input terminals, one of said second input terminals and one of said output terminals.

11. The combination of claim 9 wherein said third gate means includes a NAND gate.

12. The combination of claim 9 wherein said second circuit means includes an inverter means.

13. The combination of claim 14 further including in combination:

additional divide-by-N counter means having a plurality of input terminals;

additional binary coded decimal adder means having output terminals connected to said input terminals of said additional divide-by-N counter means and a first set of input terminals and a second set of input terminals;

additional binary coded decimal switch means having additional output terminals connected to said first set of additional input terminals of said additional binary coded decimal divider means; and additional decade counter means connected with said decade counter means and having additional output terminals connected to said second step of input terminals of said additional binary coded decimal adder means.

14. The combination of claim 4 wherein each of said first and second binary coded decimal adder means, said first and second binary coded decimal switch means, said decade counter means, said clock means, each are formed in a single monolithic integrated circuit structure.

15. In a frequency synthesizer circuit adapted to automatically provide a plurality of output signals at an output terminal, the frequency synthesizer having a phase locked loop with a divide-by-N counter having input terminals, a control circuit for adjusting the divide-by-N counter including in combination:

adder means having a plurality of output terminals connected to the input terminals of the divide-by-N counter, a first set of input terminals, and a second set of input terminals;

first circuit means having output terminals connected to said first set of input terminals of said adder means, said first circuit means being adapted to determine the lowest frequency of the output signal at the output terminal of the phase locked loop;

counter means having an input terminal, a reset terminal and a plurality of output terminals, said plurality of output terminals being connected to said second set of input terminals of said adder means;

clock means having an output terminal connected to said input terminal of said counter means, said counter means being responsive to an output signal from said clock means to provide an output signal, said adder means being responsive to said output signal of said counter means to adjust the divide-by-N counter and thereby increment the frequency of the output signal at the output terminal of the phase locked loop; and logic means connected from said output terminals of said adder means to said reset terminal of said counter means.

16. The combination of claim 15 wherein said logic means includes:

a first logic circuit having a first set of input terminals connected to said output terminals of said adder means, a second set of input terminals and output terminals;

second circuit means connected to said second set of input terminals of said first logic circuit;

a second logic circuit connected from said output terminal of said first logic circuit to said reset terminal of said counter means; and said second circuit means providing a settable input signal state to said first logic circuit, said first logic circuit and said second logic circuit being responsive to the output signal states of said adder means being the same as said settable signal states to provide a control signal which resets said counter means to thereby control the upper limit of the frequency of the output signal at the output terminal of the phase locked loop.

* * * * *